(12) United States Patent
Zhang

(10) Patent No.: US 9,099,465 B2
(45) Date of Patent: Aug. 4, 2015

(54) HIGH ASPECT RATIO VIAS FOR HIGH PERFORMANCE DEVICES

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/053,531

(22) Filed: Oct. 14, 2013

(65) Prior Publication Data

US 2015/0102496 A1    Apr. 16, 2015

(51) Int. Cl.
*H01L 21/70* (2006.01)
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/76879* (2013.01); *H01L 23/5222* (2013.01); *H01L 23/53295* (2013.01)

(58) Field of Classification Search
CPC ............... H01L 21/76816; H01L 21/76805; H01L 21/76835; H01L 23/5283
See application file for complete search history.

(56) References Cited

U.S. PATENT DOCUMENTS

| | | | |
|---|---|---|---|
| 6,455,415 B1 * | 9/2002 | Lopatin et al. | 438/628 |
| 7,501,342 B2 * | 3/2009 | Wang et al. | 438/675 |
| 7,564,133 B2 * | 7/2009 | Hamada et al. | 257/750 |
| 7,629,264 B2 * | 12/2009 | Bonilla et al. | 438/739 |
| 8,373,202 B2 * | 2/2013 | Lin et al. | 257/211 |

* cited by examiner

*Primary Examiner* — John C Ingham
(74) *Attorney, Agent, or Firm* — Seed IP Law Group PLLC

(57) ABSTRACT

Metal interconnections are formed in an integrated circuit by forming a wide trench in a dielectric layer. A dielectric fin of a second dielectric material is formed in the trench. Conductive plugs and metal lines are formed on both sides of the fin.

21 Claims, 14 Drawing Sheets

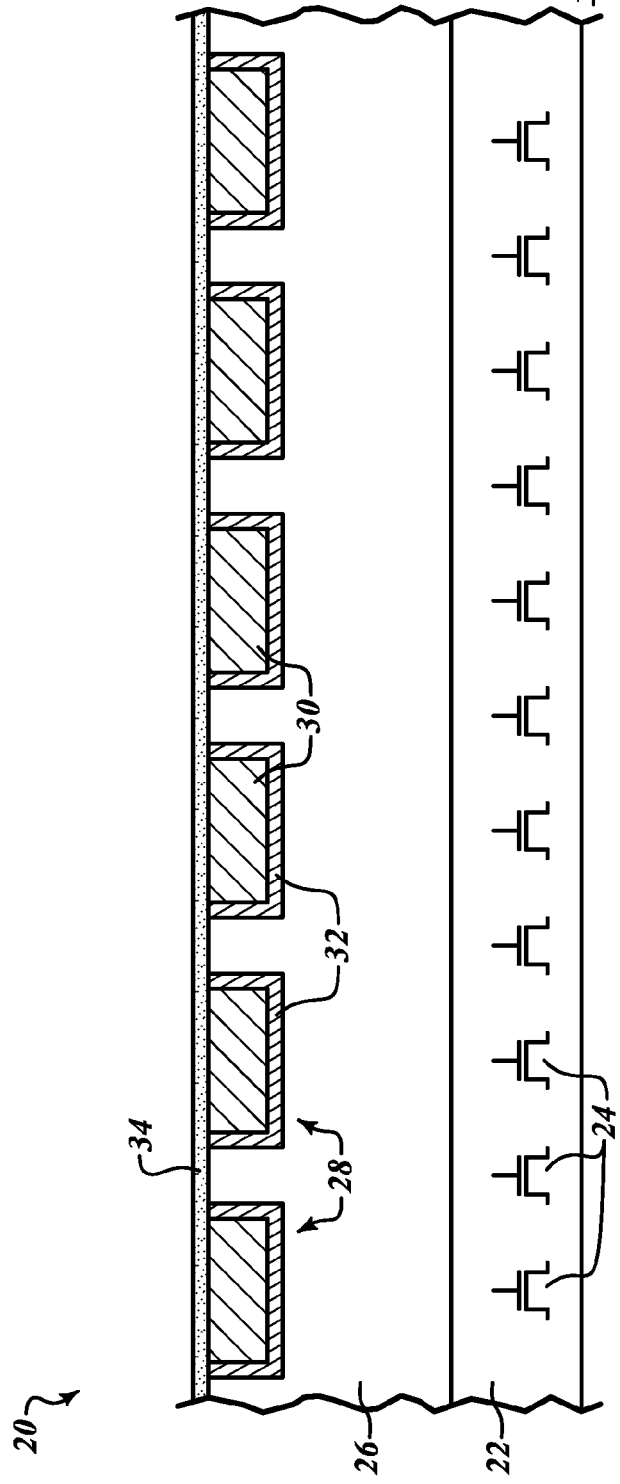

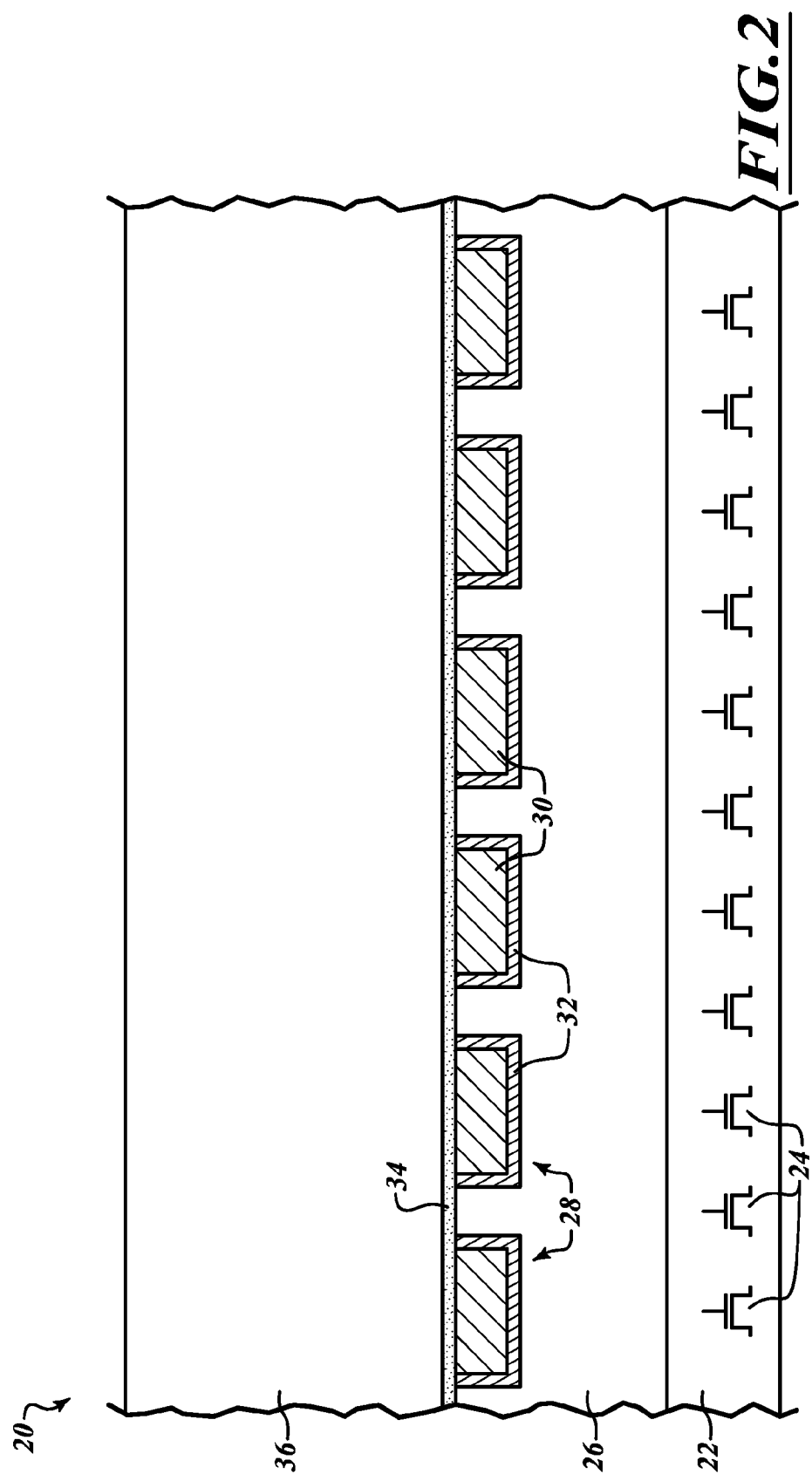

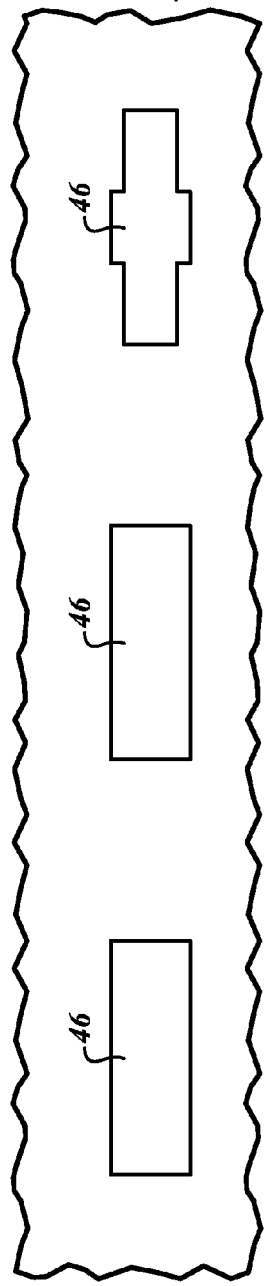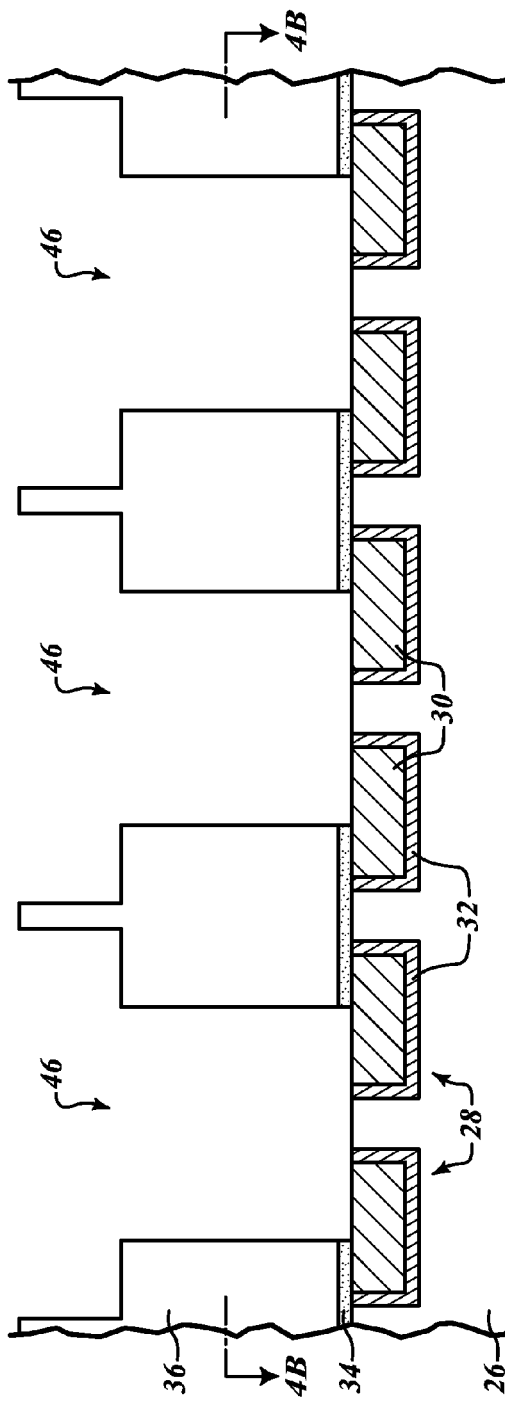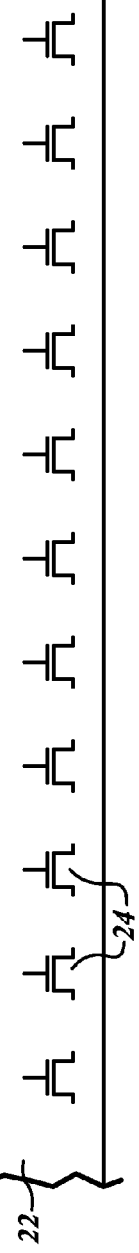

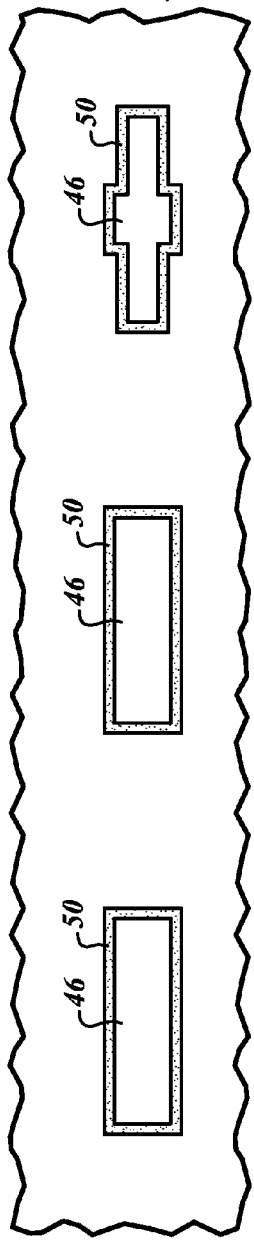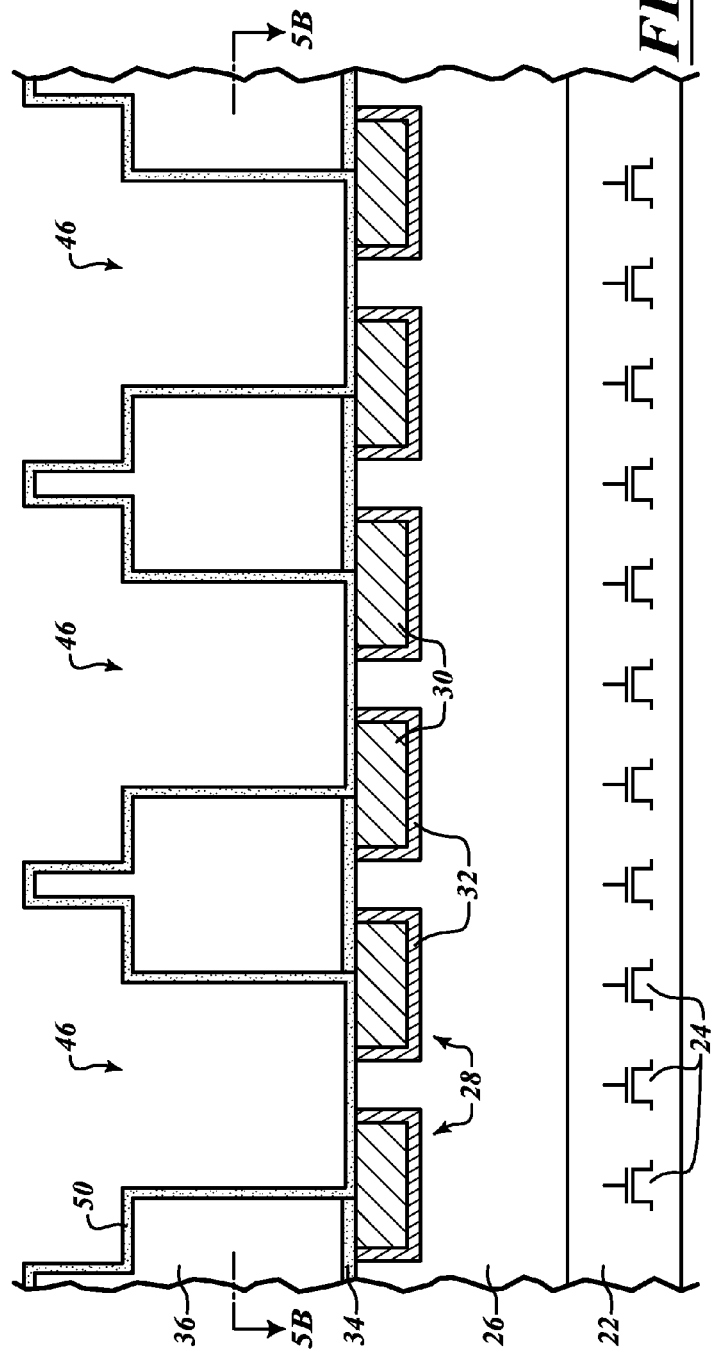

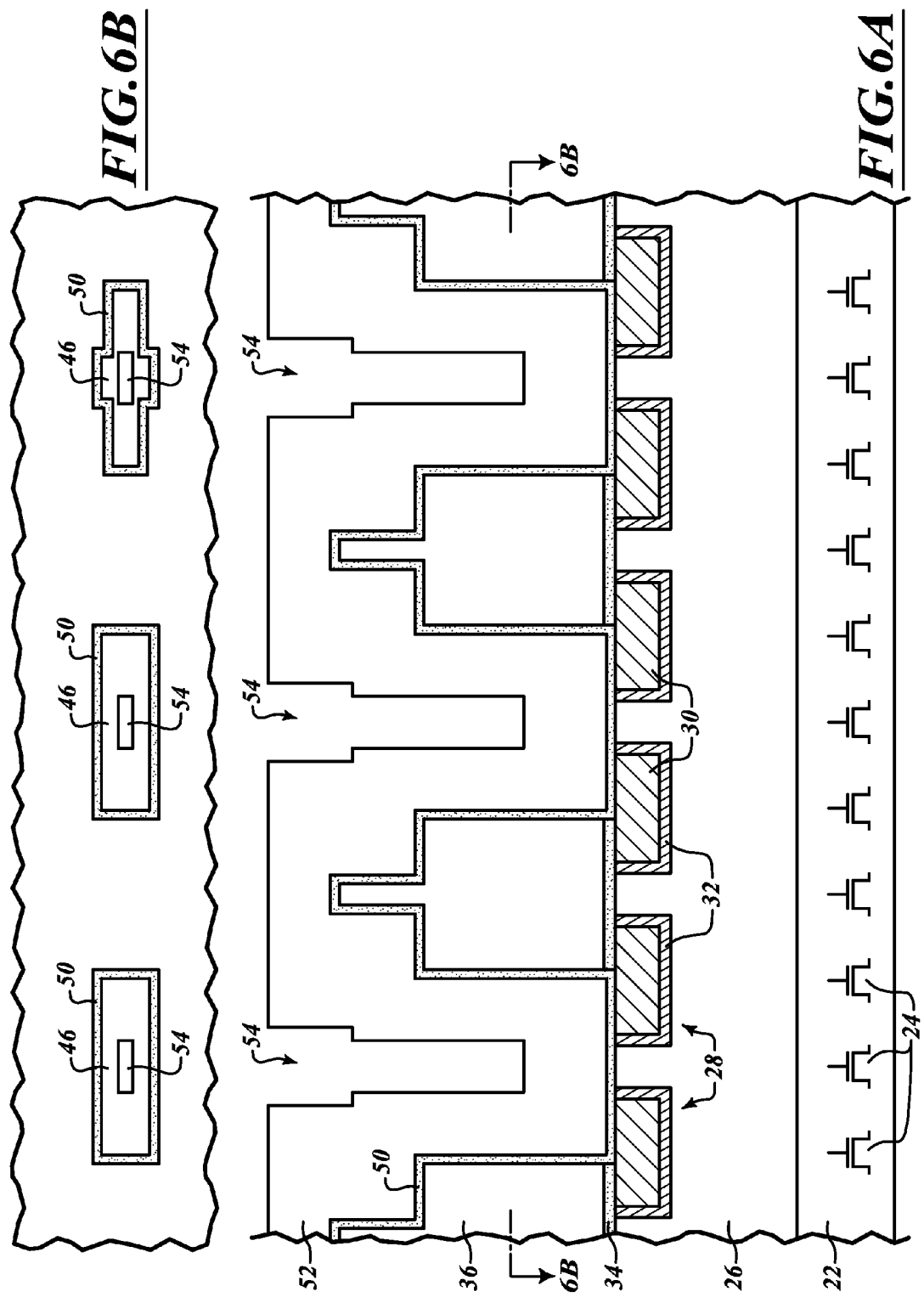

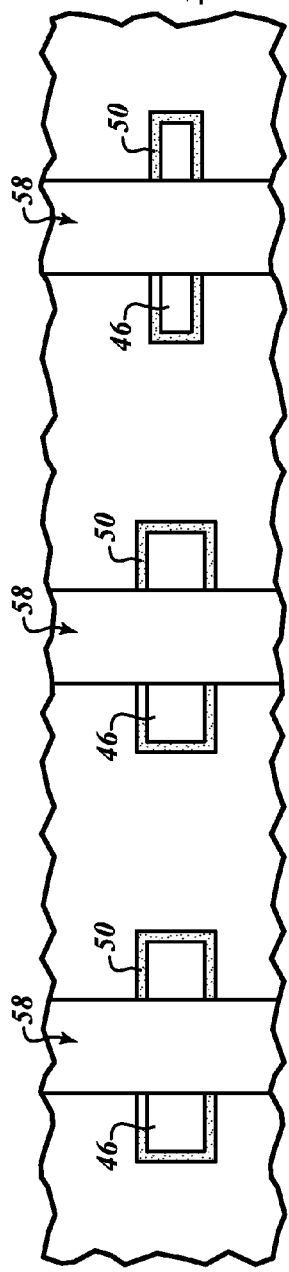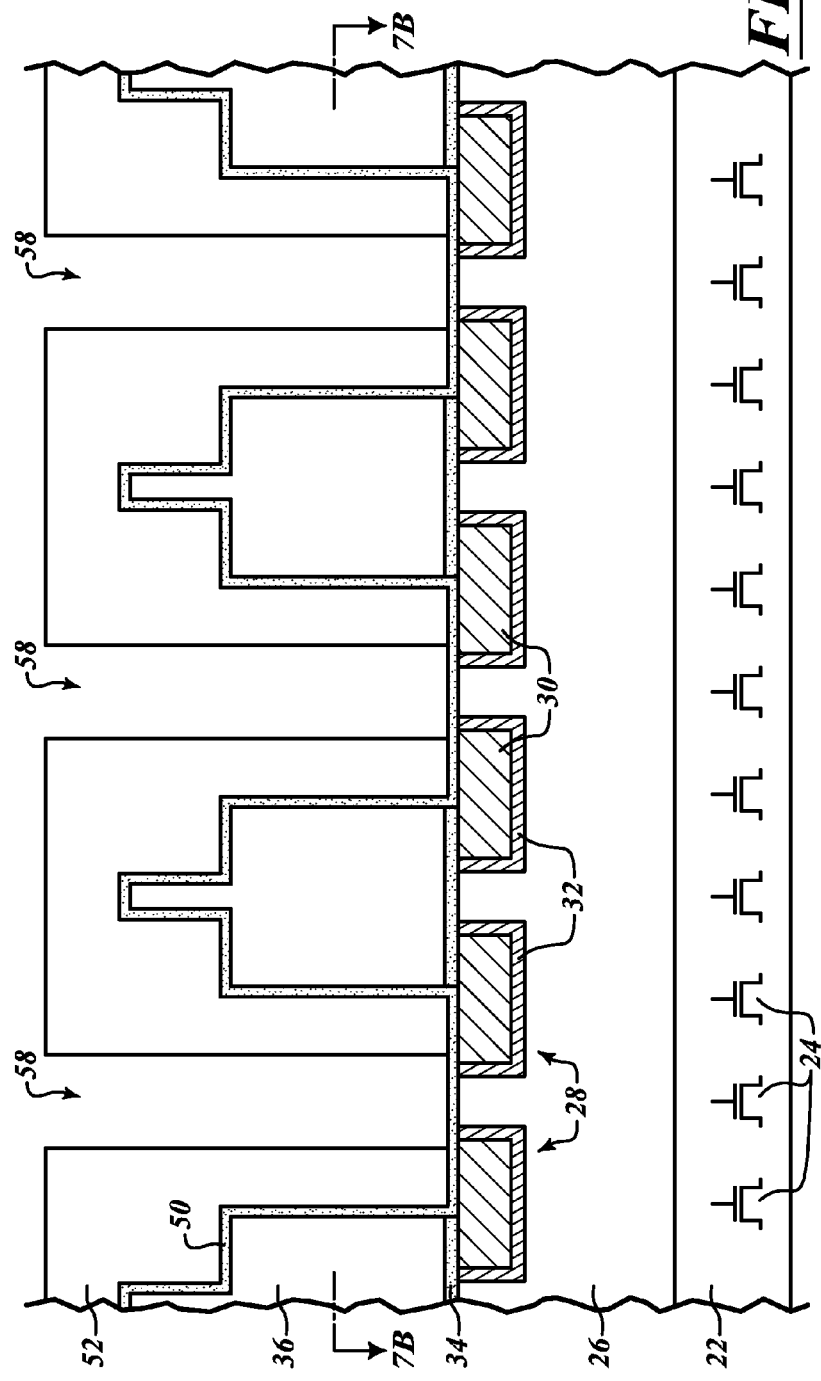

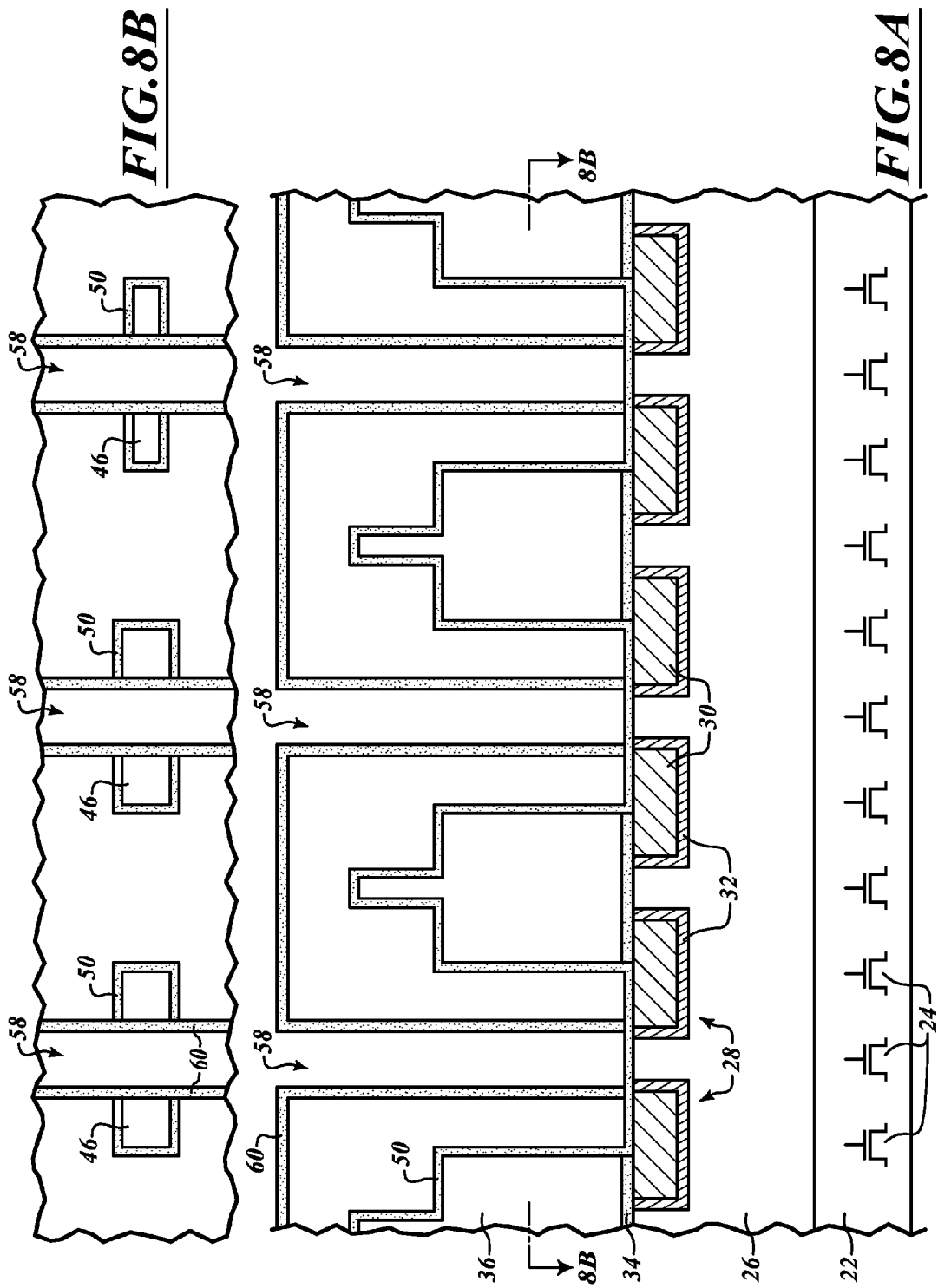

HIGH ASPECT RATIO VIAS FOR HIGH PERFORMANCE DEVICES

BACKGROUND

1. Technical Field

The present disclosure relates to the field of integrated circuit design. The present disclosure relates, more particularly, to metal interconnections within an integrated circuit die.

2. Description of the Related Art

As integrated circuit technology continues to scale down to smaller technology nodes, the back end of the line connections become very challenging and complicated to implement. Complex patterning schemes such as double patterning are used to provide smaller and smaller interconnection features. Many problems can occur within the integrated circuits as vias and metal tracks within the integrated circuit become smaller and closer together. These problems can include difficulty in alignment of photolithography masks during manufacture, as well as electromigration and time dependent dielectric breakdown during the life of the integrated circuit.

As feature sizes of integrated circuit dies shrink, it also becomes very difficult to maintain large distances between metal tracks of adjacent metal layers in order to keep the capacitance between metal tracks and adjacent metal layers low. As the capacitance between metal tracks increases, the signal propagation speed decreases. Thus, decreasing the capacitance has the effect of allowing for increased signal speeds. This typically entails maintaining large distances between the two metal layers. In order to do this, high aspect ratio vias are used. The making of high aspect ratio vias in technology nodes at or below 32 nm can become very problematic.

BRIEF SUMMARY

One embodiment is a method for forming metal interconnections in an integrated circuit die. First metal tracks are formed from a first metal layer on a substrate of an integrated circuit die. An intermetal dielectric layer is formed on the substrate and the first metal tracks.

The intermetal dielectric layer is then patterned and etched to form a plurality of wide trenches in the intermetal dielectric layer. Each wide trench exposes two of the first metal tracks. A sacrificial dielectric layer is then deposited in the wide trench. A more narrow trench is etched in the sacrificial layer and is filled with a second dielectric material having a different etch chemistry than the sacrificial dielectric layer. The sacrificial dielectric layer is then completely removed leaving a portion of the second dielectric layer dividing each wide trench into two smaller trenches.

A conductive material is deposited in the smaller trenches to form conductive plugs therein. Each conductive plug contacts a respective first metal track. Thus, two metal plugs are formed in each wide trench. This allows for metal plugs having a very high aspect ratio to be formed with very relaxed photolithography constraints. This reduces the capacitance between the first metal tracks and second metal tracks, thereby improving device performance with reduced cost.

BRIEF DESCRIPTION OF THE SEVERAL VIEWS OF THE DRAWINGS

FIG. 1 is a cross-sectional view of an integrated circuit die according to one embodiment.

FIG. 2 is a cross-sectional view of an integrated circuit die in which a dielectric layer has been formed according to one embodiment.

FIG. 4A is a cross-sectional view of an integrated circuit die in which further trenches have been opened in the first trench according to one embodiment.

FIG. 4B is a top view of the integrated circuit die of FIG. 4A according to one embodiment.

FIG. 5A is a cross-sectional view of an integrated circuit die having a protective dielectric layer deposited in the trenches to one embodiment.

FIG. 5B is a top view of the integrated circuit die of FIG. 5A according to one embodiment.

FIG. 6A is a cross-sectional view of an integrated circuit in which a sacrificial dielectric layer has been deposited in the trenches according to one embodiment.

FIG. 6B is a top view of the integrated circuit die of FIG. 6A according to one embodiment.

FIG. 7A is a cross-section of an integrated circuit die in which trenches have been etched in the sacrificial dielectric layer according to one embodiment.

FIG. 7B is a top view of the integrated circuit die of FIG. 7A according to one embodiment.

FIG. 8A is a cross-sectional view of an integrated circuit die having a protective dielectric layer deposited in the trenches to one embodiment.

FIG. 8B is a top view of the integrated circuit die of FIG. 8A according to one embodiment.

DETAILED DESCRIPTION

Figure 3A:
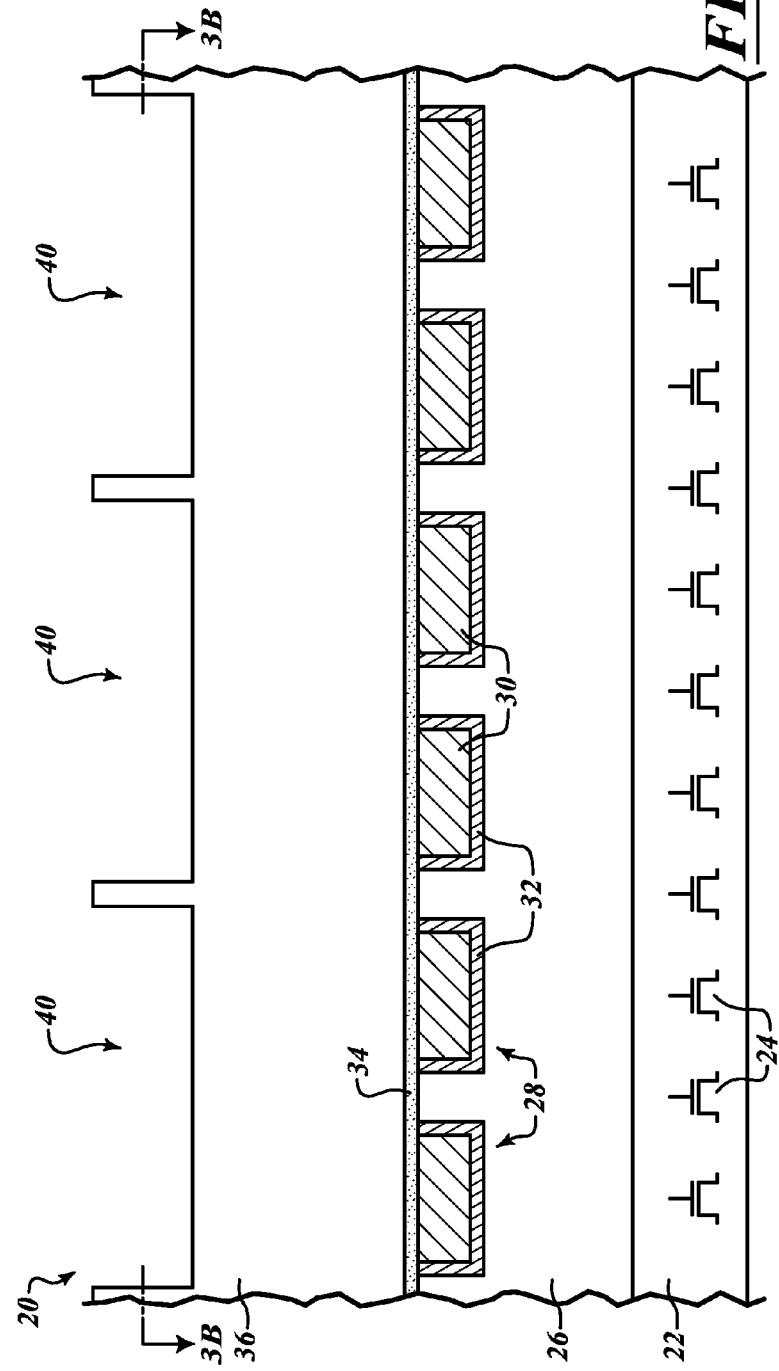
FIG. 3A is a cross-sectional view of an integrated circuit die in which first trenches have been formed according to one embodiment.

FIG. 1 is a cross-section of an integrated circuit die 20. The integrated circuit die 20 includes a semiconductor substrate 22 in which transistors 24 have been formed. A first dielectric layer 26 is positioned on the semiconductor substrate 22. A plurality of first metal tracks 28 are formed on the dielectric layer 26. Each metal track 28 includes a thick conductive layer 30 and is lined by a thin barrier layer 32. The first metal tracks 28 and the dielectric layer 26 are covered by a dielectric capping layer 34.

The dielectric layer 26 is shown as a single layer in FIG. 1, however in practice the dielectric layer 26 can include conductive and dielectric layers set on top of the semiconductor substrate 22 in which transistors 24 are formed. Though not illustrated, additional metal tracks, vias, and signal lines may be formed in dielectric layers below the dielectric layer 26.

The first metal tracks 28 are conductive signal carrying lines which allow signals to be passed through the integrated circuit die 20, including to the transistors 24 and to metal contacts outside the integrated circuit die 20, such as contact pads, solder balls, or leads. In the integrated circuit die 20, as illustrated in FIG. 1, there may be many components not illustrated which are below the first metal tracks 28 of the first metal layer.

In one embodiment the dielectric layer 26 includes silicon dioxide layers, low K dielectric layers, silicon nitride layers, or other suitable dielectric layers on the semiconductor substrate 22. The semiconductor substrate 22 is, for example, silicon or another suitable semiconductor layer in and on which transistors 24 can be formed.

In one example the first metal tracks 28 are formed of copper. The barrier layer 32 is one or more layers of titanium, titanium nitride, tantalum, tantalum nitride or other suitable barrier layers. The first metal tracks 28 are, for example, 60-100 nm in thickness. The first metal tracks 28 are separated by 32 nm, 20 nm, or any suitable distance depending on the technology node and minimum dimensions being implemented.

In many integrated circuits the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. However, any suitable metal may be used for the metal tracks, vias, and barrier layers.

The capping layer 34 is, for example, silicon nitride or preferably a silicon nitride layer including carbon. The capping layer 34 is between 200-500 Å thick. Other suitable materials and dimensions may be used for the features described in FIG. 1.

In FIG. 2, a first intermetal dielectric layer 36 has been deposited on the capping layer 34. The first intermetal dielectric layer 36 is, for example, a nanoporous dielectric layer between 600-1500 Å in thickness. As dimensions in the features of integrated circuits continue to shrink, the capacitance between conductive features of the integrated circuits begins to increase. For example, the capacitance between metal tracks formed in an integrated circuit die 20, or between metal tracks and vias formed in an integrated circuit die 20, increases as the distance between the features decreases. The capacitance between the conductive features of the integrated circuit is also proportional to the dielectric constant of the material between them. For this reason, the first intermetal dielectric layer 36 is a low K dielectric layer. This means that the dielectric constant of the intermetal dielectric layer 36 is comparatively small. This helps to reduce the capacitance between features formed in or on or under the first intermetal dielectric layer 36. The intermetal dielectric layer 36 can be, for example, a porous dielectric, such as porous silicon dioxide or other porous material. Alternatively, the first intermetal dielectric layer 36 can be a material other than a porous dielectric layer, but still formed of a material having a very low dielectric constant.

In FIG. 3A, the first intermetal dielectric layer 36 is patterned and etched to open trenches 40 in the first intermetal dielectric layer 36. The first intermetal dielectric layer 36 is not etched all the way to the capping layer 42. Instead, the intermetal dielectric layer 36 is etched using a time-based control to selectively etch to a certain depth. The depth of the trenches 40 in FIG. 3A is, for example, 52 nm. The trenches 40 in the first intermetal dielectric layer 36 can be opened by using a reactive ion etch. The time-based control which controls the depth of the reactive ion etch is, for example, a step height advanced process control. Such an advanced process control allows the etch to go to a particular depth without going further. Many other suitable dimensions for the trenches 40 can be selected according to the desired parameters of the integrated circuit die 20. Furthermore, etching techniques other than those described can be used to achieve the same or similar results, as desired.

Figure 3B:
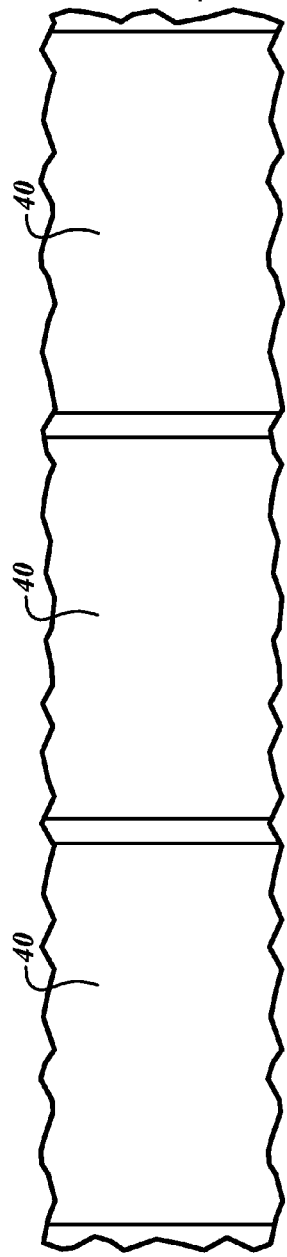
FIG. 3B is a top view of the integrated circuit die of FIG. 3A according to one embodiment.

FIG. 3B is a top plan view of the integrated circuit die 20 of FIG. 3A. FIG. 3B shows the trenches 40 open in the dielectric layer 36. As described in more detail below, each of the trenches 40 will accommodate two separate second metal tracks. Thus, a single wide etch for the trenches 40 having reduced photolithography constraints can be used to form the long second metal tracks. The advantages of the scheme are more clearly set forth below in relation to FIG. 14 below.

In FIG. 4A vias 46 are etched in the trenches 40 in the dielectric layer 36. The vias 46 are etched through the dielectric layer 36 and the capping layer 34 to expose portions of the first metal tracks 28. The vias 46 have a much higher aspect ratio than the trenches 40. As can be seen in FIG. 4B, which is a top plan view of the integrated circuit die 20 of FIG. 4A taken along the cross-section line 4B, the vias 46 do not extend as far as the trenches 40, as seen in FIG. 3B. In the example of FIG. 4B, via 46 on the far right has a different cross-sectional shape than the other vias 46.

In one embodiment, the vias 46 are vias etched in the dielectric layer 36 using a reactive ion etch. The vias are, for example, 60-100 nm wide and 100 to 150 nm deep. As we set forth in more detail below, each of the vias 46 will accommodate two plugs connecting the first metal tracks 28 to second metal tracks whose formation will be described hereafter. Because two plugs will be formed in the single wide via etch described above, these plugs will have a much higher aspect ratio than a single plug formed in each of the vias 46. Because vias 46 can be formed using relaxed photolithography constraints, high aspect ratio plugs can be formed reliably and with low cost. The formation of the plugs and second metal tracks will be described in more detail below.

In FIG. 5A, a protective dielectric layer 50 is deposited on the first intermetal dielectric layer 36 in the trenches 40 and vias 46, and on exposed portions of the first metal tracks 28. The protective dielectric layer 50 has a high etch selectivity with respect to the first intermetal dielectric layer 36. The protective dielectric layer 50 also has low K value while retaining high etch selectivity with respect to the first intermetal dielectric layer 36.

In one embodiment, the protective dielectric layer 50 is the same material as the capping layer 34, for example, a silicon carbide layer with nitrogen, a silicon nitride, silicon nitride layer, or a silicon nitride layer including carbon. Alternatively, the protective dielectric layer 50 can be a different material than that of the capping layer 34, but chosen from the same group of materials listed above. The protective dielectric layer 50 can also be of any other suitable material.

The protective dielectric layer 50 is, for example, 300-500 Å thick. The protective dielectric layer 50 can be deposited by chemical vapor deposition processes such as plasma enhanced chemical vapor deposition or low pressure chemical vapor deposition. The layer 50 is of a higher density than the dielectric layer 36 in the preferred embodiment, and a high density chemical vapor deposition process can be used. Alternatively the protective dielectric layer 50 can be formed using other suitable methods or processes.

FIG. 5B is a top plan view of the integrated circuit die 20 of FIG. 5A, taken along the cross-section line 5B. As can be seen in FIG. 5B, vias 46 are completely lined by the protective dielectric layer 50.

In FIG. 6A, a conformal sacrificial dielectric layer 52 is deposited on the protective dielectric layer 50 in vias 46 and trenches 40 and above the top of the dielectric layer 36. The conformal deposition of the sacrificial dielectric layer 52 in vias 46 and trenches 40 leaves gaps 54 in the sacrificial dielectric layer 52. The sacrificial dielectric layer 52 is, in one example, a silicon oxide layer formed in a low temperature process. The sacrificial dielectric layer 52 is selectively etched with respect to the protective dielectric layer 50.

FIG. 6B is a top plan view of the integrated circuit die 20 of FIG. 6A, taken along cross-section line 6B. FIG. 6B shows the relatively thin profile of the gaps 54 born in the sacrificial dielectric layer 52.

In FIG. 7A, the sacrificial dielectric layer 52 has been etched to form trenches 58. The trenches 58 extend through the sacrificial dielectric layer 52 and the barrier layer 52 to expose the protective dielectric layer 34 on the dielectric layer 26. In one example the trenches 58 are formed using photolithography techniques to form a patterned mask of photoresist on the sacrificial dielectric layer 52 and the intermetal dielectric layer 36. A reactive ion etch is then performed to etch the layer sacrificial dielectric layer 52 at locations exposed by the patterned mask. The reactive ion etch etches through the conductive material 54 and the barrier layer 52. The reactive ion etch stops when the protective dielectric layer 34 has been exposed. In one example the trenches 58 are 32 nm wide, but the trenches can be 58 10-50 nm wide.

FIG. 7B is a top plan view of the integrated circuit die 20 of FIG. 7A taken along cross-section line 7B. FIG. 7B shows that the trenches 58 etched in the sacrificial dielectric layer 52 extend all the way through the vias 46. As will be discussed in more detail below, the length of the trenches 58 corresponds to the length of second metal tracks to be formed hereafter. The trenches 58 divide the vias 46 into two parts. These two parts of vias 46 will each have a conductive plug therein as will be described further below. The only constraint on the trench 58 is that it leaves part of the sacrificial layer 52 above each of the metal tracks 28. As long as this constraint is met, the photolithography requirements for the trenches 58 are satisfied. Thus, very relaxed photolithography constraints can be used to form two plugs each having high aspect ratios. The high aspect ratio plugs provide improved performance for the metal interconnections of the integrated circuit die 20 as described in more detail below.

In FIG. 8A, a protective dielectric layer 60 is deposited on the sacrificial dielectric layer 52 and in the trenches 58. The protective dielectric layer 60 has a high etch selectivity with respect to the sacrificial dielectric layer 52. The protective dielectric layer 60 also has low K value while retaining high etch selectivity with respect to the sacrificial dielectric layer 52. In one embodiment, the protective dielectric layer 60 is the same material as the protective dielectric layer 50, for example, a silicon carbide layer with nitrogen, a silicon nitride, silicon nitride layer, or a silicon nitride layer including carbon. Alternatively, the protective dielectric layer 50 can be a different material than that of the protective dielectric layer 50, but chosen from the same group of materials listed above. The protective dielectric layer 60 can also be of any other suitable material.

The protective dielectric layer 60 is, for example, 300-500 Å thick. The protective dielectric layer 60 can be deposited by chemical vapor deposition processes such as plasma enhanced chemical vapor deposition or low pressure chemical vapor deposition. Alternatively the protective dielectric layer 50 can be formed using other suitable methods or processes.

FIG. 8B is a top plan view of the integrated circuit die 20 of FIG. 8A, taken along cross-section line 8B. As can be seen in FIG. 8B, the protective dielectric layer 60 lines the walls of the trenches 58 all along their length.

Figure 9:
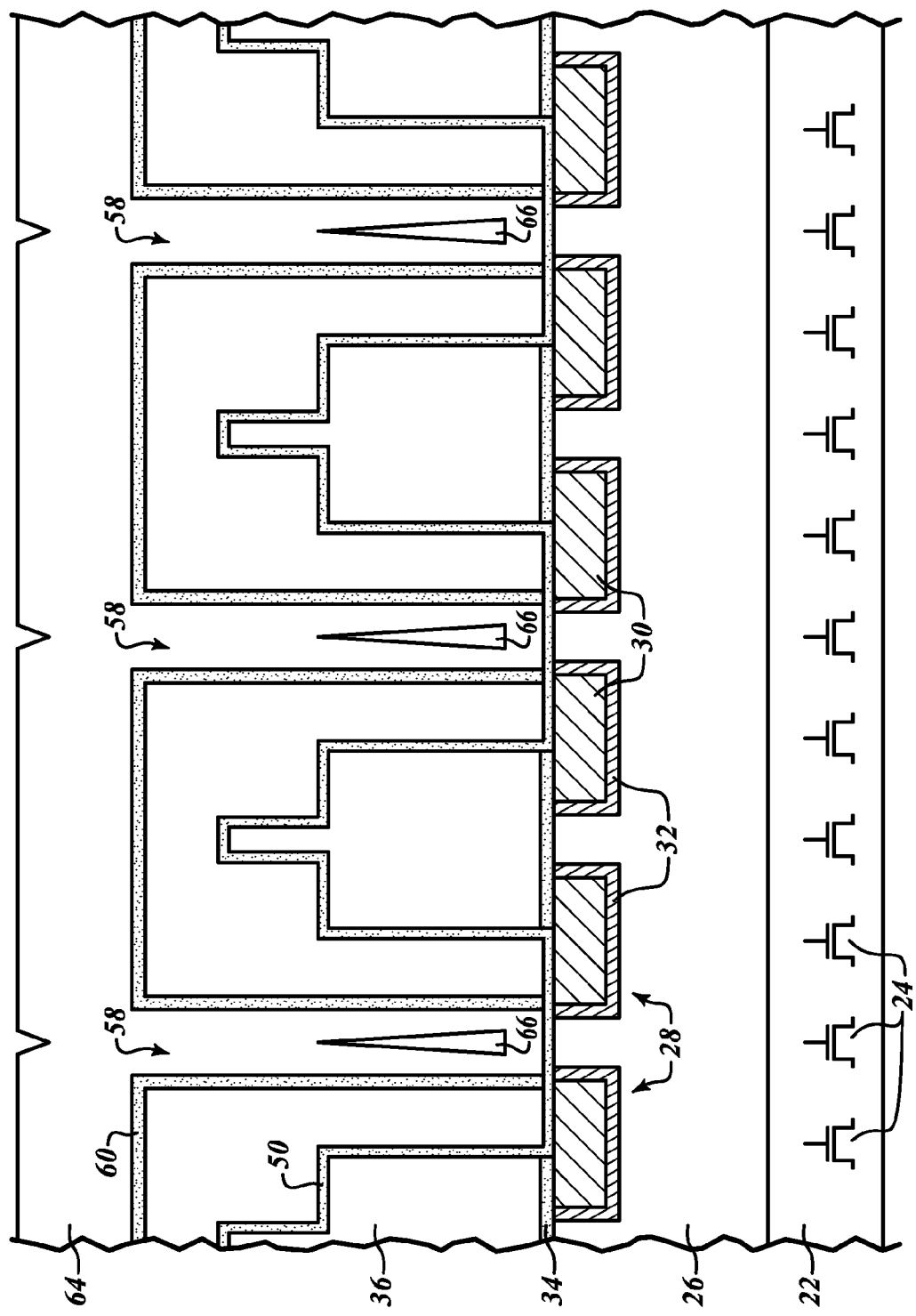
FIG. 9 is a cross-section of an integrated circuit die in which the dielectric layer has been deposited in the trenches according to one embodiment.

In FIG. 9, a conformal dielectric layer 64 is deposited on the protective dielectric layer 60 and in the trenches 58. The conformal dielectric layer 64 is of a different material than the conformal dielectric layer 52. The conformal dielectric layer 64 can be selectively etched with respect to the conformal dielectric layer 52. Because the conformal dielectric layer 64 is deposited conformally, air gaps 66 will likely be formed in the trenches 58. The air gaps 66 can serve to reduce capacitance between plugs which will be formed subsequently as will be described in more detail below. The formation of air gaps 66 is not required, but is likely to occur as top conformal deposition of layer 64 closes the top of trench 58 before the bottom is full.

In one embodiment the conformal dielectric layer 64 is a silicon nitride layer which can be selectively etched with respect to the sacrificial dielectric layer 52 and the protective dielectric layer 50. The conformal dielectric layer 64 should therefore be of a sufficiently different composition with respect to the protective dielectric layer 50 that it can be selectively etched with respect thereto, though they may contain the same elements in different proportions.

Figure 10:
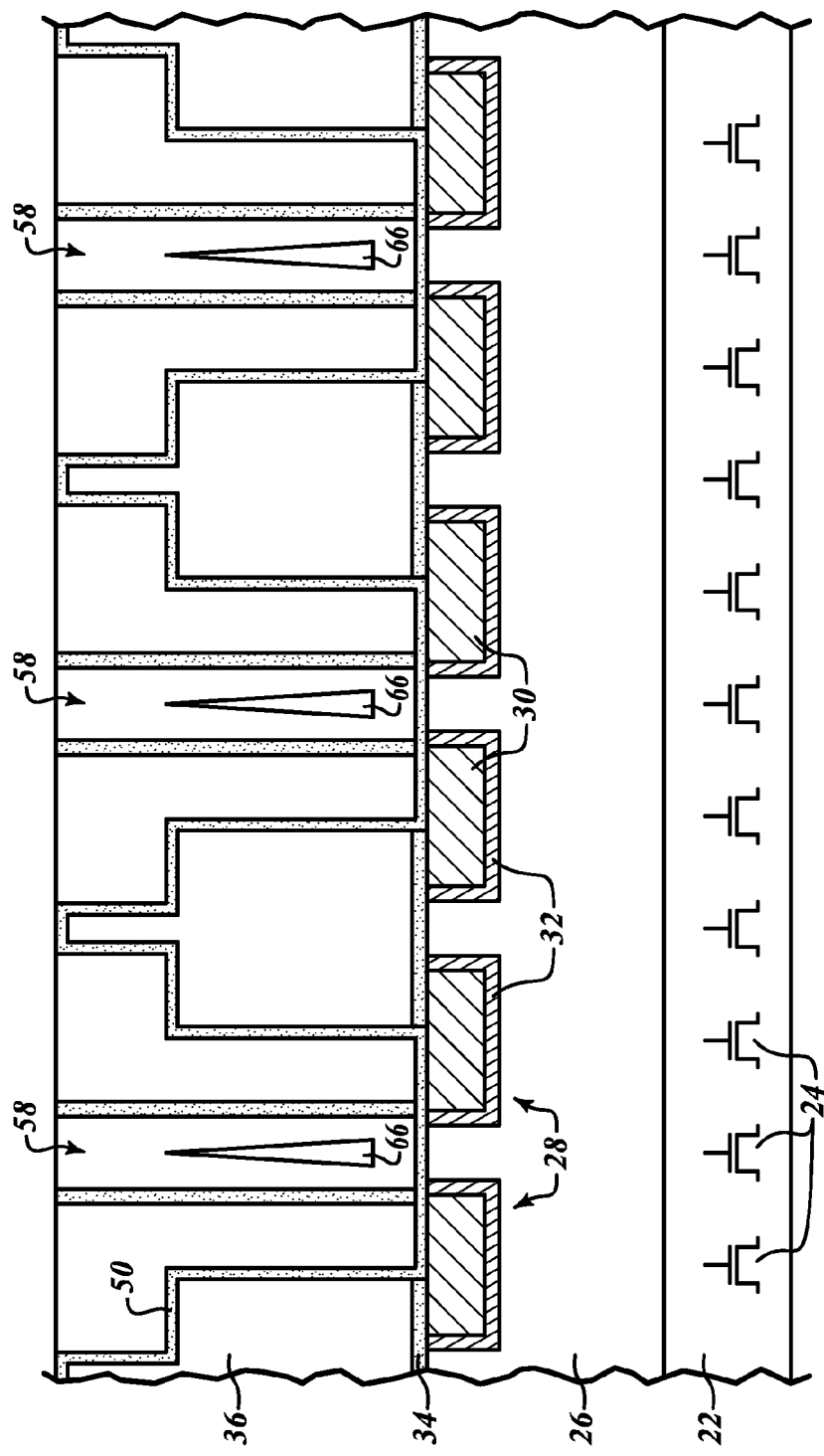
FIG. 10 is a cross-section of an integrated circuit die after the planarization process has been performed according to one embodiment.

In FIG. 10, the conformal dielectric layer 64 is etched to have a top surface even with the top surface of the protective dielectric layer 50. In one embodiment, the conformal dielectric layer 64 is etched via a CMP process which stops on the surface of the protective dielectric layer 50. In this way the conformal dielectric layer 64 can be etched down to the same level as the top surface of the protective dielectric layer 50 and can have a flat top surface.

Figure 11:
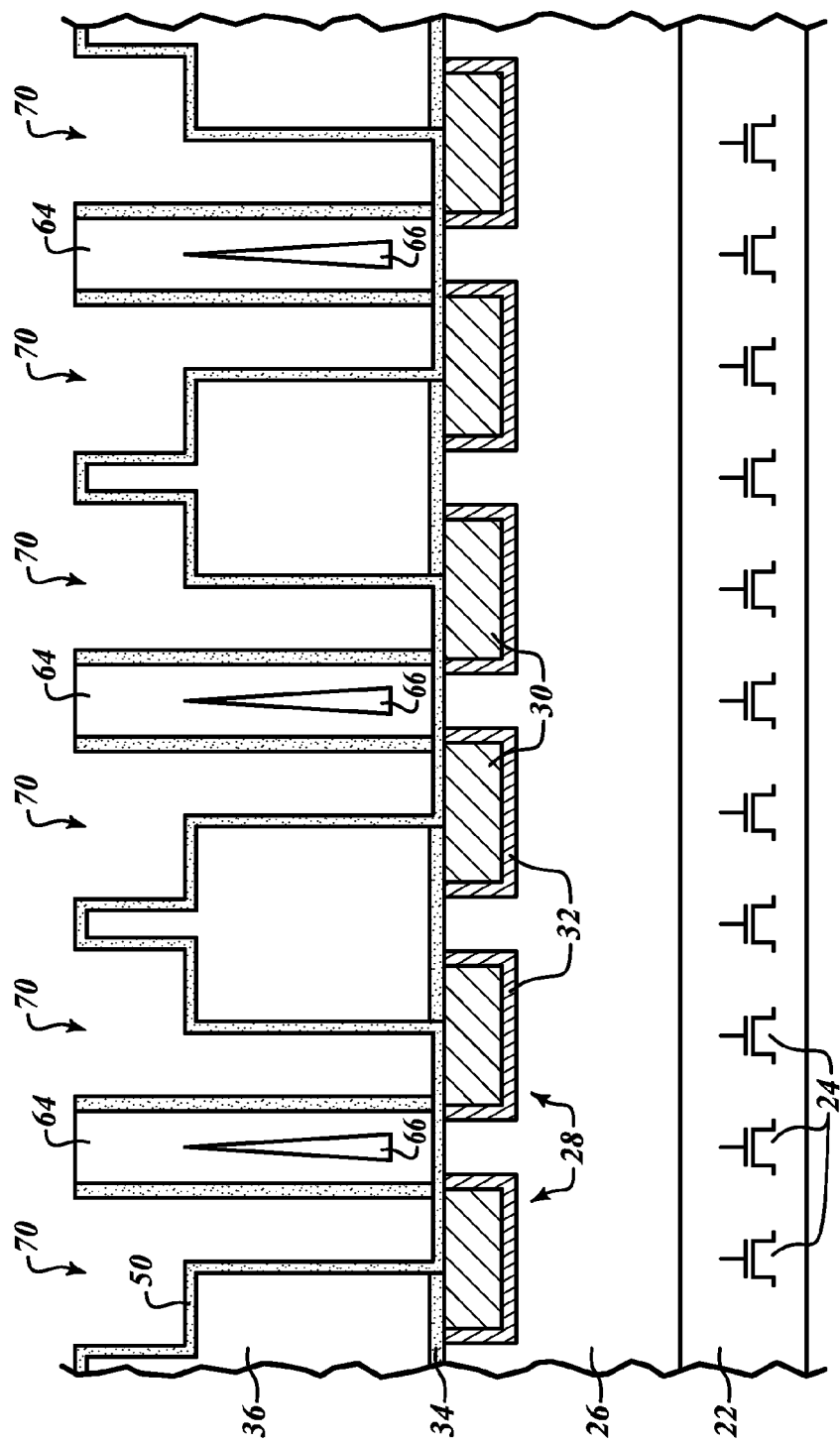
FIG. 11 is a cross-section of an integrated circuit die in which the sacrificial dielectric layer has been removed according to one embodiment.

In FIG. 11 the sacrificial dielectric layer 52 is completely removed, leaving openings 70. Openings 70 correspond to vias 46 and trenches 40 formed previously, but now each is divided into two parts by the remaining portions of the dielectric layer 64. The remaining portions of the dielectric layer 64 have the shape of fins that extend a long ways into and out of the FIG. 11 as is shown more clearly with respect to FIGS. 8A and 8B in which trenches 58 were formed. The portions of the openings 70 which correspond to the trenches 40 extend all along the length of the remaining portions of the conformal dielectric layer 64 and will subsequently be filled with second metal tracks separated from each other by the remaining portions of the dielectric layer 64. The portions of the openings 70 corresponding to vias 46 will be filled with metal plugs which will serve to electrically connect the first metal tracks 28 with the second metal tracks which will fill the trenches 40. Because the sacrificial dielectric layer 52 can be selectively etched with respect to the protective dielectric layer 50 and a conformal dielectric layer 64, no mask is needed to remove the sacrificial dielectric layer 52 while leaving the openings 70 for the metal tracks and plugs as will be described in more detail below.

Figure 12:
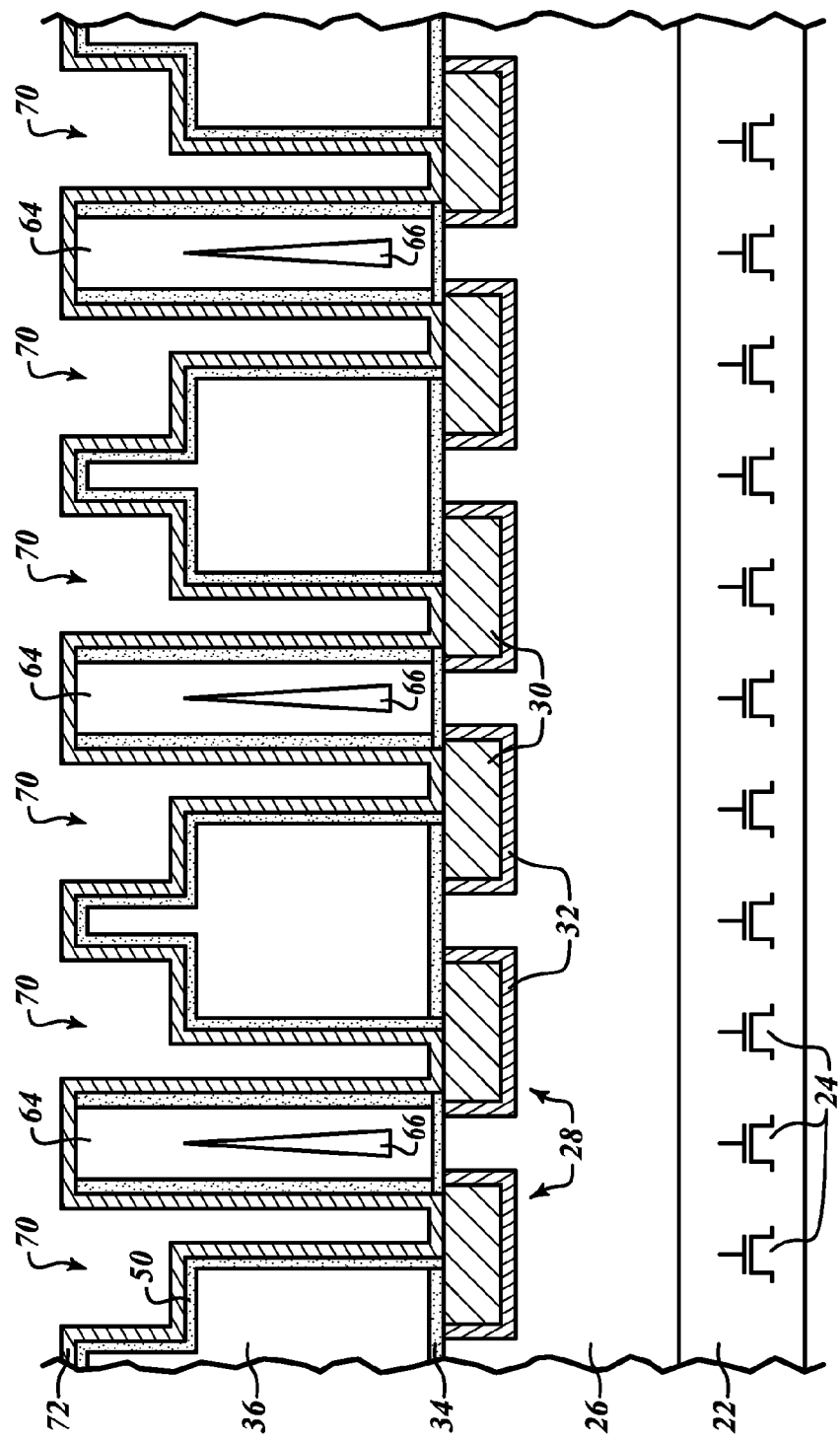
FIG. 12 is a cross-section of an integrated circuit die after a barrier metal layer has been deposited according to one embodiment.

In FIG. 12, a thin conductive barrier layer 72 is deposited on the protective dielectric layer 50 and in the openings 70. The barrier layer 72 provides a barrier to keep mobile metal atoms from metal tracks and plugs from entering dielectric layers. The barrier layer 72 also acts as an adhesive layer for a subsequently deposited metal layer. The barrier layer 72 is, for example, one or more layers of titanium, titanium nitride, tantalum, or tantalum nitride. Alternatively other suitable materials can be used to form the barrier layer 72. When Ti and/or TiN are used, the barrier layer 72 is, for example, 4-20 Å thick. When Ta and/or TaN are used for the barrier layer 72, the barrier layer 44 is, for example, 60 Å thick. Of course other suitable thicknesses and materials can be used. Portions of the protective dielectric layer 50 are moved to expose portions of the first metal tracks 28 prior to depositing the barrier layer 72. The barrier layer 72, therefore, is electrically connected to the first metal tracks 28.

Figure 13:
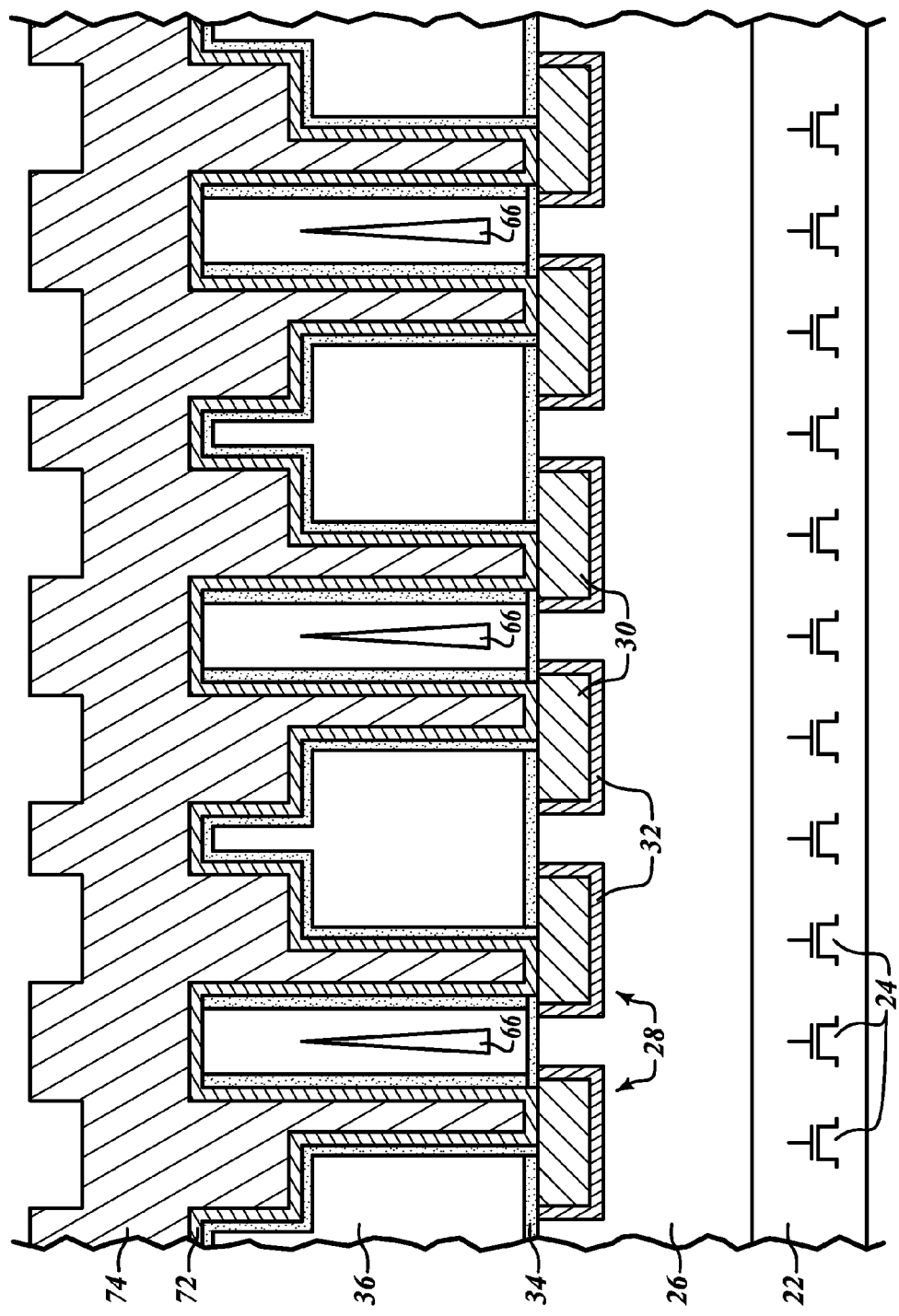
FIG. 13 is a cross-section of an integrated circuit die in which a conductive material has been deposited according to one embodiment.

In FIG. 13, a thick layer of conductive material 74 is deposited on the barrier layer 72 and in the openings 70. The conductive material 74 fills the openings 70 and extends above the upper surface of the dielectric layer 36. The conductive material 74 is in direct contact with the barrier layer 72.

The conductive material 74 is, in this example, copper. However, other suitable materials can be used for the conductive material 74. The conductive material can be formed using an electroplating and electroless process. In particular, the conductive material 74 can be deposited by first depositing a very thin copper seed layer in a physical vapor deposition (PVD) process. The seed layer is, for example, 10 nm thick. This is followed by an electroplating process that deposits a copper layer about 400 nm thick. Other suitable processes can be used to deposit the conductive material 74.

Figure 14:
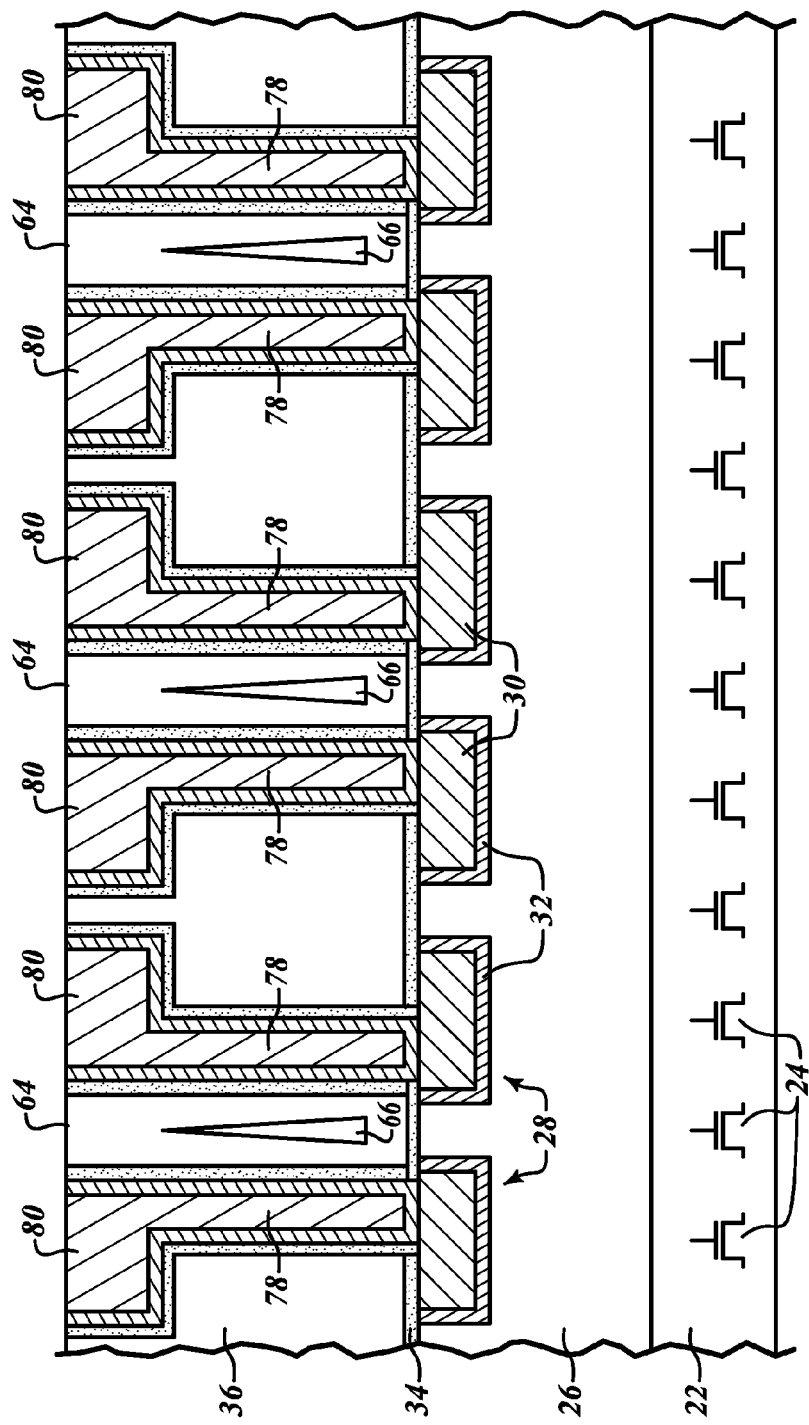
FIG. 14 is a cross-section of an integrated circuit die in which the conductive material has been planarized according to one embodiment.

In FIG. 14, a planarization step has been performed to remove excess conductive material from the dielectric layer 36. The planarization step is, for example, a chemical mechanical planarization step configured to stop on the dielectric layer 36. This has the effect of removing excess conductive material while forming discrete second metal tracks 80 from the conductive material 74 and the barrier layer 72. The second metal tracks 80 have respective sides and bottom covered by the protective dielectric layer 50. The second metal tracks 80 are formed from a second metal layer, or metal two. The conductive material 74 also forms plugs 78 in the previous vias 46. The plugs 78 electrically connect the first metal tracks 28 to the second metal tracks 80.

The remaining portions of the dielectric layer 64 electrically isolate the second metal tracks 80 from each other. The remaining portions of the dielectric layer 64 also electrically isolate the plugs 78 from each other. In particular, the openings 70 and the remaining portions of the dielectric layer 64 define a plurality of conductive plugs 78 and second metal tracks 80. The conductive plugs 80 are integral with respect to respective ones of the second metal tracks 80.

The first metal tracks 28, and the second metal tracks 80 are conductive signal carrying lines which allow signals to be passed through the integrated circuit die 20, including to the transistors 24 and to metal contacts outside the integrated circuit die 20, such as contact pads, solder balls, or leads. While first metal tracks 28 are described as being formed of the first metal layer and the second metal tracks 80 are described as being formed in the second metal layer, it is understood that other metal layers below the first metal tracks may be present. The first metal tracks 28, the conductive plugs 78, the second metal tracks 80, and other metal interconnections in the integrated circuit die allow connection between transistors 24 formed in the semiconductor substrate and with components outside the integrated circuit die 20. In this manner electric signals can be passed throughout the integrated circuit die 20.

In one example the conductive plugs 78, as well as the second metal tracks 80, are formed of copper. In many integrated circuits, the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. Any suitable metals and other materials may be used for the metal tracks, vias, and barrier layers.

The conductive plugs 78 and the second metal tracks 80 formed according to principles of the present disclosure have many benefits over previous designs.

In previous designs it was very difficult to sufficiently reduce the capacitance between metal tracks of adjacent metal layers in order to allow high signal propagation speeds. As the capacitance between metal tracks of adjacent metal layers increases, the signal speed decreases. High aspect ratio vias between metal tracks of adjacent metal layers help to reduce the capacitance between metal tracks of adjacent metal layers. However, as the technology nodes continue to decrease below 32 nm, it becomes very difficult to make high aspect ratio vias. The lithography and etching techniques employed in previous designs are costly and require very high precision in order to maintain device reliability. Alignment steps requiring very high accuracy are among the most expensive processes in integrated circuit manufacturing. The more strict the photolithographic requirements are, the more costly the alignment steps are. In the process according to principles of the present disclosure as illustrated in relation to FIGS. 1-14, relaxed photolithographic standards can be used. This can reduce the cost of manufacturing the integrated circuit die 20, and can increase reliability of the integrated circuit die 20. Additionally, the conductive plugs 78, and the second metal tracks 80, are defined in batch steps having relaxed photolithography constraints. This further reduces the number of masks required to process the integrated circuit die 20.

In particular, the width of the plugs 78 is very thin, for example 14-40 nm, while the height of the plugs 78 is 100-150 nm. This means that the aspect ratio of the plugs 78 is very high. For example, if the width of the plugs is 30 nm and the height of the plugs is 120 nm, the vias aspect ratio is 120 nm/30 nm=4.0. Yet the lithography and alignment constraints are relatively relaxed. This is because the width of the plugs 78 is defined by the width of vias 46 and the width of the remaining portions of the dielectric layer 64. The width of vias 46 is about 60-100 nm as described previously with relation to FIG. 4B. Next, after the sacrificial layer 52 has been deposited in the vias 46, 32 nm wide trenches 58 are etched in the sacrificial dielectric layer 52 in the vias 46. The alignment requirements of the mask for etching the trenches 58 in the sacrificial dielectric layer 52 are not critical as the only constraint that must be met is that the trench leaves a portion of the sacrificial dielectric layer 52 over each of the two first metal tracks 28 below each via 46. Because the constraints on the alignment of this mask are not strict, time and costs are reduced for manufacturing the integrated circuit die 20. After the trenches 58 are filled with the dielectric layer 64, the sacrificial layer 52 is removed. This leaves opening 70 which corresponds to the remaining portions of vias 46 not filled by the dielectric layer 64.

The plugs 78 formed in these openings 70 have very high aspect ratios as described previously. This means that there is a large amount of dielectric material of the dielectric layer 36 between the first metal tracks 28 and the second metal tracks 80.

The dielectric layer 64 as shown in FIG. 14 provides many benefits. One additional benefit is that the air gaps 66 between adjacent plugs 78 reduce the capacitance between the plugs 78. It is beneficial to reduce the capacitance between conductive plugs and metal interconnections in an integrated circuit die as much as possible except where the capacitance is specifically desired. Capacitance between metal interconnections in an integrated circuit die can cause undesired crosstalk between the metal interconnections. This can cause signals to be erroneously passed through metal interconnections through which they should not be passed. This can also cause an electrical signal to fail to pass through a conductive feature that it should pass through. As two metal structures come closer together, the capacitance between them increases. Thus, as features on an integrated circuit die become smaller and smaller, the capacitance increases because the metal structures become closer and closer to each other. The capacitance between two conductive structures decreases as the dielectric constant of the material between them decreases. Thus, one way to decrease capacitance between metal interconnection structures is to decrease the dielectric constant of the material between them. For this reason, ultra low K dielectric materials are often used as the intermetal dielectric layer between metal layers. Air has an even lower dielectric constant than ultra low K dielectric materials. The dielectric constant of air is approximately 1. Therefore, it can be beneficial to have the space filled with air as much as possible between the conductive plugs 78. This reduces the capacitance between the conductive plugs 78, and improves the reliability of the electrical characteristics of the metal interconnecting structures.

While the conductive material 54 has been described as being copper, other conductive materials can be used. In particular, aluminum, a combination of copper and aluminum, gold, tungsten, or other suitable conductive materials can be used to form metal interconnections.

A further benefit of the integrated circuit die 20 of FIG. 14 is that the protected dielectric layers 34, 50, and 60 improve the electromagnetic characteristics of the conductive plugs 78 and the metal tracks 28 and 80. As signals and currents flow through the conductive plugs of an integrated circuit die and metal tracks, there is a risk that the dielectric material surrounding the plugs and metal tracks can deteriorate over time. This problem is most prominent when the dielectric material is an ultra low K dielectric material, which is often the case. As the dielectric material breaks down, metal atoms can diffuse from conductive plugs and metal tracks into dielectric materials. However, because the conductive plugs 78 and the first and second metal tracks 28 and 80 of FIG. 14 are encapsulated in the protected dielectric layers 34, 50, and 60, this problem of electromigration and dielectric breakdown can be alleviated.

As described previously, the dielectric layers 34, 50, and 60 are more robust dielectric materials than are commonly used in intermetal dielectric layers. In particular, the protective dielectric layers 34, 50, and 60 are made from silicon nitride or another dielectric material, including silicon with nitrogen and carbon. These materials are more resistant to breakdown and will not allow electromigration to occur. The protective dielectric layers 34, 50, and 60 are made of similar but not necessarily identical compositions. Thus, the protective dielectric layers 34, 50, and 60 may be selectively etched with respect to each other in order to provide flexibility in manufacturing the integrated circuit die 20. Of course in some embodiments, the dielectric layers 34, 50, and 60 can be of the same composition.

Although not shown in FIG. 14, further metal interconnections can be formed above the second metal tracks 78. This can be done by simply repeating the processes described in relation to FIGS. 2-14. This can be done a number of times for as many metal layers as will be used in the integrated circuit die 20. After this is done, passivation layers and contact pads can be formed on the top of the integrated circuit die 20. Conductive leads, solder balls, or pins can be coupled to the conductive pads to allow electrical connection from outside of the integrated circuit die 20 to the transistors 24 within the integrated circuit die through the metal interconnecting structures. The integrated circuit die 20 can then be encapsulated in a molding compound, or placed in a lead frame, or in any other suitable package configuration to protect the integrated circuit die 20 from further damage. Many other materials and processes can be used in forming an integrated circuit die according to principles of the present disclosure. All such other materials, processes, and dimensions fall within the scope of the present disclosure.

Many processes and structures for forming an integrated circuit die have not been described in detail in this disclosure. Such other processes and structures are known to those of skill in the art and can be implemented in light of the present disclosure.

The features in the figures are not necessarily drawn to scale. The processes and structures described in relation to FIGS. 1-14 are given by way of example. Other types of materials, thickness, widths, structures and patterns can be used in accordance with principles of the present disclosure. All such alternative embodiments fall within the scope of the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a first and a second metal track overlying a substrate;
    forming a first dielectric layer of a first dielectric material overlying the first and second metal tracks and the substrate;
    forming a trench having a T-shaped profile overlying the first and the second metal tracks by etching the first dielectric layer;
    depositing a second dielectric material after the forming of the trench and the first dielectric layer, the second dielectric material forming a fin of the second dielectric material in the center of the T-shaped trench, the fin dividing the T-shaped trench into two parts, each part defining a metal plug width; and
    forming first and second metal plugs by depositing a first conductive material in the first and second parts of the T-shaped trench, the first and second metal plugs being electrically isolated from each other by the fin, the first metal plug contacting the first metal track, the second metal plug contacting the second metal track, the metal plugs each having an aspect ratio of height to width that exceeds 2.5.

2. The method of claim 1 comprising forming a third and a fourth metal track, the first plug electrically connecting the first and the third metal tracks, the second plug electrically connecting the second and fourth metal tracks.

3. The method of claim 2 wherein forming the first and second metal plugs and the third and fourth metal tracks of the first conductive material includes depositing the first conductive material in the first trench.

4. The method of claim 3 wherein the first conductive material is copper.

5. The method of claim 1 wherein the fin is positioned above a portion of the substrate between the first and the second metal tracks.

6. The method of claim 1 wherein the metal plug widths are each less than 30 nm wide.

7. The method of claim 6 wherein the first and second metal plugs each have a height greater than 100 nm.

8. A method, comprising:
forming a first and a second metal track overlying a substrate;
forming a first dielectric layer of a first dielectric material overlying the substrate;
forming a first trench overlying the first and the second metal tracks by etching the first dielectric layer;
forming a fin of a second dielectric material in the first trench, by:
forming a sacrificial dielectric layer in the first trench;
forming a second trench in the sacrificial dielectric layer; and
depositing the second dielectric material in the second trench; and
forming a first and a second metal plug in the first trench by depositing a first conductive material in the first trench, the first and second metal plugs being electrically isolated from each other by the fin, the first metal plug contacting the first metal track, and the second metal plug contacting the second metal track.

9. The method of claim 8 comprising removing the sacrificial dielectric layer from the first trench.

10. The method of claim 9 wherein the sacrificial dielectric layer is selectively etchable with respect to the second dielectric material.

11. The method of claim 10 comprising forming a protective dielectric layer on the first dielectric layer prior to forming the sacrificial dielectric layer.

12. The method of claim 11 comprising forming the sacrificial dielectric layer on the protective dielectric layer.

13. A method, comprising:
forming a plurality of first metal tracks overlying a substrate;
forming a first dielectric layer of a first dielectric material overlying the first and second metal tracks and the substrate;
forming a plurality of trenches having a T-shaped profile overlying the first and second metal tracks in the first dielectric layer, each trench having a T-shaped profile and being positioned over two respective first metal tracks;
depositing a second dielectric material after forming the trench and the first dielectric layer, the second dielectric material forming a plurality of fins, each fin being positioned in a center of a respective T-shaped trench, the fin dividing the T-shaped trench into two parts, each part defining a metal plug width; and
forming a plurality of pairs of metal plugs, each pair being positioned in a respective trench on opposite sides of the respective fin in the trench, each metal plug contacting a respective first metal track, each metal plug including a portion having an aspect ratio of height to width that exceeds 2.5.

14. The method of claim 13 comprising forming a plurality of second metal tracks overlying the metal plugs, each second metal track contacting a respective metal plug.

15. The method of claim 14 wherein forming the metal plugs and the second metal tracks includes depositing a conductive material in the first trenches.

16. A method, comprising:
forming a plurality of first metal tracks overlying a substrate;
forming a first dielectric layer of a first dielectric material overlying the substrate;
forming a plurality of first trenches in the first dielectric layer, each trench being positioned over two respective first metal tracks;
forming a plurality of fins, each fin being positioned in a respective first trench;
forming plurality of pairs of metal plugs, each pair being positioned in a respective first trench on opposite sides of the respective fin in the first trench, each metal plug contacting a respective first metal track; and
forming a plurality of air gaps each in a respective fin.

17. An integrated circuit, comprising:
a substrate in which transistors are formed;
a first and a second metal track overlying the substrate;
a first dielectric layer of a first dielectric material overlying the substrate;
a trench in the first dielectric layer overlying the first and second metal tracks, the trench having a T-shaped profile;
a fin of a second dielectric material centered in the T-shaped trench; and
a first and a second metal plug within the T-shaped trench, the metal plugs electrically isolated from each other by the fin, the first plug contacting the first metal track, and the second plug contacting the second metal track, each of the metal having an aspect ratio of height to width that exceeds 2.5.

18. The integrated circuit of claim 17, comprising:
a third metal track contacting the first metal plug; and
a fourth metal track contacting the second metal plug.

19. The integrated circuit of claim 18, comprising protective dielectric layer of a third dielectric material on sidewalls of the trench.

20. An integrated circuit, comprising:
a substrate in which transistors are formed;
a first and a second metal track overlying the substrate;
a first dielectric layer of a first dielectric material overlying the substrate;
a trench in the first dielectric layer overlying the first and second metal tracks;
a fin of a second dielectric material on the trench; and
a first and a second metal plug in the trench and electrically isolated from each other by the fin, the first plug contacting the first metal track, the second plug contacting the second metal track, the first dielectric material being silicon oxide and the second dielectric material being silicon nitride.

21. The integrated circuit of claim 20, wherein the fin includes an air gap formed in the second dielectric material.

* * * * *

UNITED STATES PATENT AND TRADEMARK OFFICE
CERTIFICATE OF CORRECTION

PATENT NO. : 9,099,465 B2  
APPLICATION NO. : 14/053531  
DATED : August 4, 2015  
INVENTOR(S) : John H. Zhang Page 1 of 1

It is certified that error appears in the above-identified patent and that said Letters Patent is hereby corrected as shown below:

Claims

Column 11, Lines 44-45, Claim 13:
"forming a plurality of trenches having a T shaped profile overlying the first and second metal tracks in the first" should read, --forming a plurality of trenches overlying the first and second metal tracks in the first--.

Column 12, Line 5, Claim 15:
"plugs and the second metal tracks includes deposing a conductive" should read, --plugs and the second metal tracks includes depositing a conductive--.

Column 12, Line 6, Claim 15:
"conductive material in the first trenches." should read, --conductive material in the trenches.--.

Signed and Sealed this
Twelfth Day of April, 2016

Michelle K. Lee
*Director of the United States Patent and Trademark Office*